(12) United States Patent
Yeh et al.

(10) Patent No.: US 9,847,512 B2
(45) Date of Patent: Dec. 19, 2017

(54) ELECTRONIC DEVICE PACKAGE STRUCTURE AND MANUFACTURING METHOD THEREOF

(71) Applicant: Industrial Technology Research Institute, Hsinchu (TW)

(72) Inventors: Shu-Tang Yeh, Taichung (TW); Jia-Chong Ho, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 275 days.

(21) Appl. No.: 14/091,341

(22) Filed: Nov. 27, 2013

(65) Prior Publication Data

US 2014/0175405 A1    Jun. 26, 2014

Related U.S. Application Data

(60) Provisional application No. 61/745,549, filed on Dec. 22, 2012.

(30) Foreign Application Priority Data

Jun. 28, 2013  (TW) .............................. 102123263 A

(51) Int. Cl.
| | | |
|---|---|---|
| H01L 23/26 | (2006.01) | |
| H01L 51/52 | (2006.01) | |
| H01L 51/00 | (2006.01) | |

(52) U.S. Cl.
CPC ...... *H01L 51/5259* (2013.01); *H01L 51/0097* (2013.01); *H01L 51/5256* (2013.01); *Y02E 10/549* (2013.01); *Y02P 70/521* (2015.11)

(58) Field of Classification Search
USPC .......................................... 257/40
See application file for complete search history.

(56) References Cited

U.S. PATENT DOCUMENTS

| | | |
|---|---|---|
| 6,576,351 B2 | 6/2003 | Silvernail |
| 6,866,901 B2 | 3/2005 | Burrows et al. |
| 6,998,776 B2 | 2/2006 | Aitken et al. |
| 7,541,671 B2 | 6/2009 | Foust et al. |
| 7,816,676 B2 | 10/2010 | Fourst et al. |
| 8,093,512 B2 | 1/2012 | Chen et al. |

(Continued)

FOREIGN PATENT DOCUMENTS

| | | |
|---|---|---|
| JP | 2009122410 | 6/2009 |
| TW | 570472 | 1/2004 |

(Continued)

OTHER PUBLICATIONS

M. S. Weaver et al., "Organic light-emitting devices with extended operating lifetimes on plastic substrates," Applied Physics Letters, vol. 81, No. 16, Oct. 14, 2002, pp. 2929-2931.

(Continued)

*Primary Examiner* — Fernando L Toledo
*Assistant Examiner* — Lawrence-Linh T Nguyen
(74) *Attorney, Agent, or Firm* — JCIPRNET

(57) ABSTRACT

A package structure of an electronic device is provided. The substrate of such package structure has at least one embedded gas barrier structure, which protects the electronic device mounted thereon and offers good gas barrier capability so as to extend the life of the electronic device.

30 Claims, 18 Drawing Sheets

(56) References Cited

U.S. PATENT DOCUMENTS

| | | | |
|---|---|---|---|
| 2004/0232413 A1* | 11/2004 | Yamazaki | H01L 27/1214 257/43 |
| 2005/0184372 A1 | 8/2005 | Asahi et al. | |
| 2005/0224935 A1 | 10/2005 | Schaepkens et al. | |
| 2005/0249901 A1 | 11/2005 | Yializis et al. | |
| 2006/0118933 A1 | 6/2006 | Haba | |
| 2006/0226523 A1 | 10/2006 | Foust et al. | |
| 2007/0152956 A1 | 7/2007 | Danner et al. | |
| 2007/0172971 A1 | 7/2007 | Boroson | |
| 2008/0006819 A1 | 1/2008 | McCormick et al. | |
| 2008/0135998 A1 | 6/2008 | Witvrouw et al. | |
| 2010/0258346 A1* | 10/2010 | Chen et al. | 174/521 |
| 2011/0101564 A1 | 5/2011 | Keenihan et al. | |
| 2011/0151200 A1 | 6/2011 | Erlat et al. | |
| 2011/0164307 A1* | 7/2011 | Paolini, Jr. | G02F 1/167 359/296 |
| 2011/0175523 A1 | 7/2011 | Kostka et al. | |

FOREIGN PATENT DOCUMENTS

| | | |
|---|---|---|
| TW | 200603416 | 1/2006 |
| TW | 200829070 | 7/2008 |
| TW | 201205733 | 2/2012 |
| TW | 201212180 | 3/2012 |

OTHER PUBLICATIONS

Francois H. Fabreguette and Rikard A. Wind, "Ultrahigh x-ray reflectivity from W/Al2O3 multilayers fabricated using atomic layer deposition," Applied Physics Letters, Jan. 6, 2006, pp. 1-3.

P.E. Burrows et al., "Ultra barrier flexible substrates for flat panel displays," Displays, vol. 22, Issue 2, May 2001, pp. 65-69.

Jay S. Lewis and Michael S. Weaver, "Thin-Film Permeation-Barrier Technology for Flexible Organic Light-Emitting Devices," IEEE Journal of Selected Topics in Quantum Electronics, vol. 10, No. 1, Jan./Feb. 2004, pp. 45-57.

Sung-Ryong Kim et al., "Effects of argon and oxygen flow rate on water vapor barrier properties of silicon oxide coatings deposited on polyethylene terephthalate by plasma enhanced chemical vapor deposition," Thin Solid Films, Jul. 25, 2009, pp. 1929-1934.

Han-Ki Kim et al., "High-quality thin-film passivation by catalyzer-enhanced chemical vapor deposition for organic light-emitting diodes," Applied Physics Letters, Jan. 2, 2007, pp. 1-4.

Weidong Huang et al., "Low temperature PECVD SiNx films applied in OLED packaging," Materials Science & Engineering B, Jan. 21, 2003, pp. 248-254.

Jin-Seong Park et al., "Thin film encapsulation for flexible AMOLED: a review," Semiconductor Science and Technology, Feb. 14, 2011, pp. 1-9.

Raymond C. Kwong et al., "Current status of electrophosphorescent device stability," Organic Electronics, vol. 4, Issues 2-3, Sep. 2003, pp. 155-164.

X Chu et al., "Analysis of Failure Modes of Multilayer Thin Film Encapsulation of OLED Devices and Ca Films," International Display Workshops, vol. 11, 2004, pp. 1427-1428.

"Office Action of Taiwan Related Application, Application No. 102101184," dated Apr. 20, 2015, p. 1-p. 6, in which the listed references were cited.

"Office Action of Taiwan Counterpart Application", dated Nov. 12, 2015, p. 1-p. 8, in which the listed references were cited.

* cited by examiner

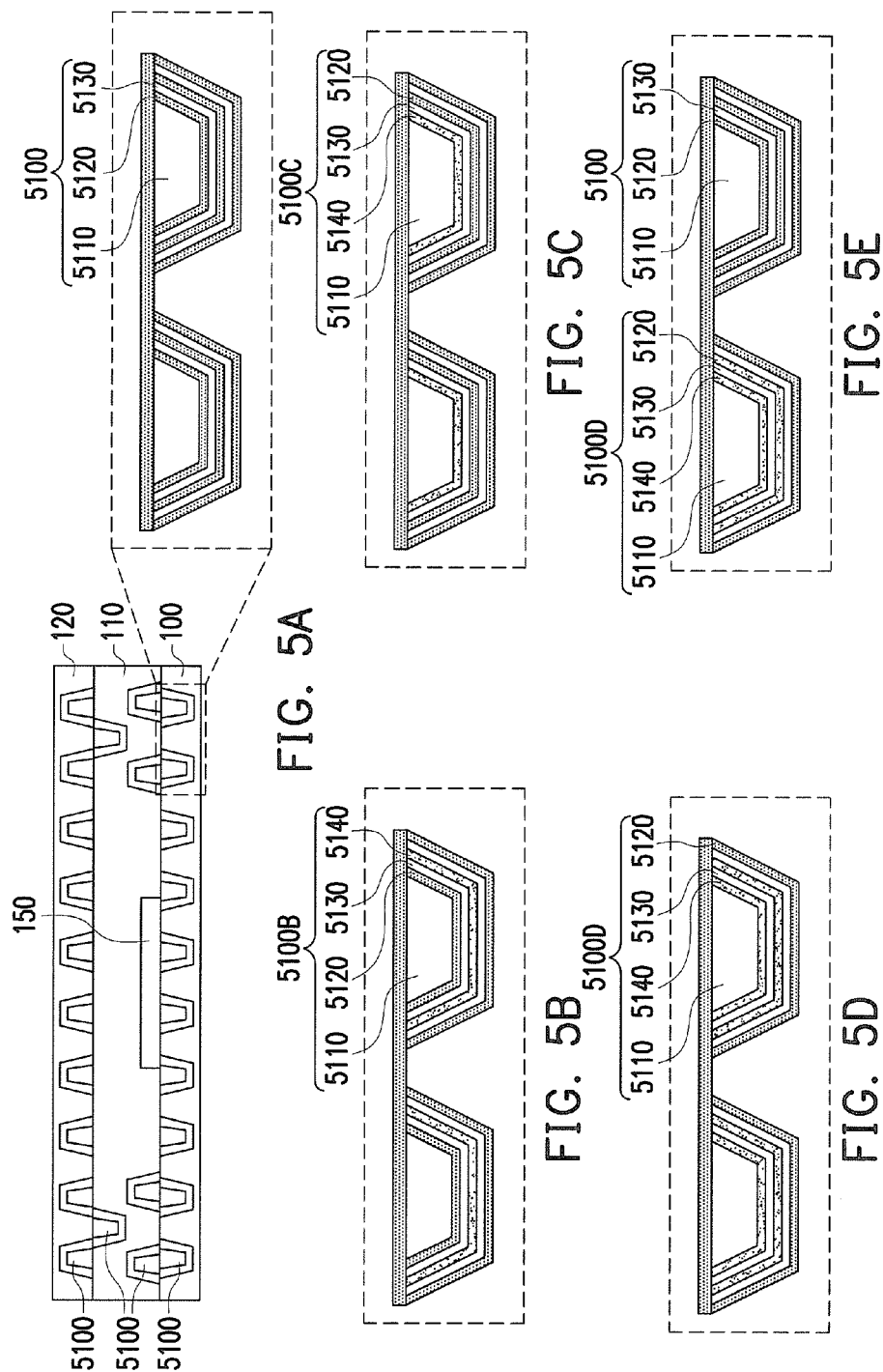

ELECTRONIC DEVICE PACKAGE STRUCTURE AND MANUFACTURING METHOD THEREOF

This application claims the priority benefits of U.S. provisional application Ser. No. 61/745,549, filed on Dec. 22, 2012 and Taiwan application serial no. 102123263, filed on Jun. 28, 2013. The entirety of each of the above-mentioned patent applications is hereby incorporated by reference herein and made a part of this specification.

TECHNICAL FIELD

The disclosure relates to a package structure and more particularly, to a package structure of an electronic device.

BACKGROUND

Elements in an electronic apparatus are designed more and more precisely therefore requirements on gas barrier capability are increased. Generally, an index for determining the gas barrier capability is a water vapor transmission rate (WVTR) and an oxygen transmission rate (OTR). For a flexible or soft substrate structure, the requirement on a penetration barrier layer is quite strict. Thus, for the flexible packaging technology, it is indeed to have structures or materials with gas barrier capability.

SUMMARY

An embodiment of the disclosure introduces a package structure of an electronic device. The package structure includes a first substrate, a second substrate and at least one electronic device. The first substrate has a first surface opposite to a second surface thereof. The electronic device is disposed on the first surface of the first substrate. The electronic device package structure further includes an adhesive material disposed on the first substrate and covering the electronic device and the first surface of the first substrate. The second substrate has a third surface and a fourth surface opposite to the third surface, and the second substrate is disposed above the first substrate and the adhesive material. At least one of the first substrate and the second substrate has a gas barrier structure embedded therein, and the first substrate is adhered to the second substrate through the adhesive material, such that the electronic device and the gas barrier structure are located between the first substrate and the second substrate.

An embodiment of the disclosure introduces a method for manufacturing a package structure of an electronic device. A substrate mounted on a carrier is provided and a plurality of trenches is formed in the substrate. A gas barrier structure is formed to fill the plurality of trenches.

An embodiment of the disclosure introduces a method for manufacturing a package structure of an electronic device. A first substrate mounted on a carrier is provided. A first gas barrier layer is formed on the first substrate. A plurality of trenches is formed in the first gas barrier layer and a first gas barrier structure on the first substrate is defined.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 5A-5E are enlarged cross-sectional views exemplarily illustrating a part of the substrate having the gas barrier structure according to embodiments of the disclosure.

DETAILED DESCRIPTION OF DISCLOSED EMBODIMENTS

Figure 1A:
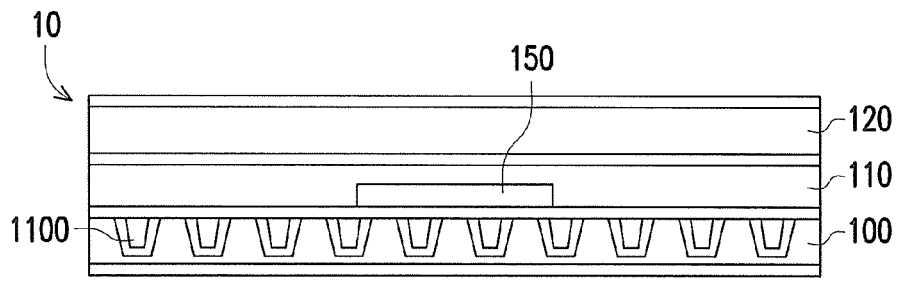
FIGS. 1A-1E are cross-sectional views exemplarily illustrating an electronic device package structure according to embodiments of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a cross-sectional views exemplarily illustrating an electronic device package structure according to an embodiment of the disclosure. In the present embodiment, a design of a flexible or soft substrate is exemplarily described, but the substrate is not limited to be the flexible or soft substrate. An electronic device package structure 10 includes at least one first substrate 100, an electronic device 150 on the first substrate 100, an adhesive material 110 disposed on the first substrate 100 and a second substrate 120. The second substrate 120 is disposed above the first substrate 100 and the adhesive material 110. The electronic device 150 is located between the second substrate 120 and the first substrate 100. As the second substrate 120 and the first substrate 100 are adhered together through the adhesive material 110, the electronic device 150 is encapsulated within the adhesive material 110. The electronic device 150 may be an environmental sensitive element, such as an active matrix or a passive matrix organic light emitting diode (OLED) element, and may be a top-emission or bottom-emission type OLED element.

The second substrate 120 or the first substrate 100 may be, for example, a flexible substrate. The material of the flexible substrate may be polyethylene terephthalate (PET), polyethylene naphthalate (PEN), polyethersulfone (PES), polymethyl methacrylate (PMMA), polycarbonate (PC), polyimide (PI) or a metal foil. A material of the adhesive material 110 may be acrylic resin, epoxy resin or silicone, and a material of the adhesive material 110 may be, for example, a pressure-sensitive adhesive material, a filler adhesive material, a thermal curable adhesive material or an ultraviolet curable adhesive material.

The electronic device package structure 10 may be a double-side light emitting apparatus, and the first substrate and the second substrate are transparent. If the package structure 10 is configured as a single-side light emitting apparatus, at least one substrate (i.e., either the first or the second substrate) thereof is transparent, while the other substrate may be transparent, non-transparent or designed with a reflective layer, such that light generated from the electronic device 150 may emit from one of the first substrate 100 and the second substrate 120.

The first substrate 100 has a gas barrier structure 1100 disposed in the first substrate 100, i.e., embedded in the first substrate 100, and when the second substrate 120 is adhered to the first substrate 100, the gas barrier structure 1100 is located under the electronic device 150 and between the second substrate 120 and the first substrate 100.

Figure 1B:
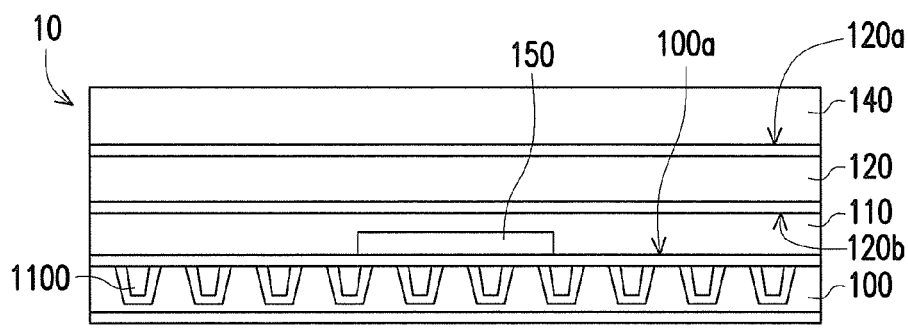

FIGS. 1B-1E are cross-sectional views exemplarily illustrating an electronic device package structure according to embodiments of the disclosure. The electronic device package structure shown in FIGS. 1B-1E are variations of the electronic device package structure shown in FIG. 1A. The electronic device package structure 10 may further include an auxiliary substrate 140, which is a function substrate having a touch function, a color-filtering function, a color conversion and/or a polarization function. Referring to FIG. 1B, the auxiliary substrate 140 of the electronic device package structure 10 is located on an upper surface 120*a* of the second substrate 120 and above the second substrate 120 and the electronic device 150.

Figure 1C:
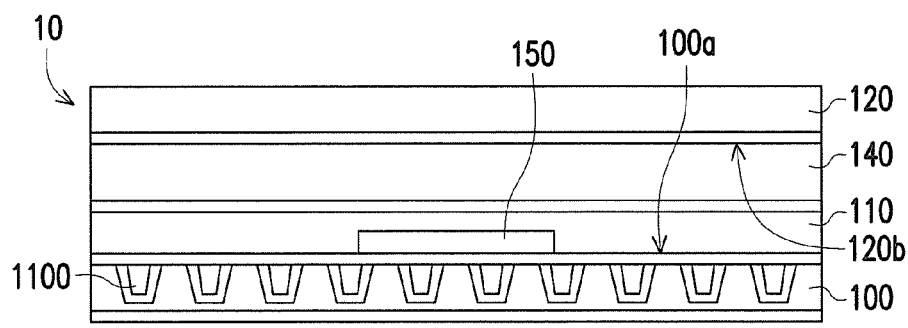

Referring to FIG. 1C, the auxiliary substrate 140 of the electronic device package structure 10 is located on a lower surface 120*b* of the second substrate 120, between the second substrate 120 and the adhesive material 110 and above the electronic device 150.

Figure 1D:
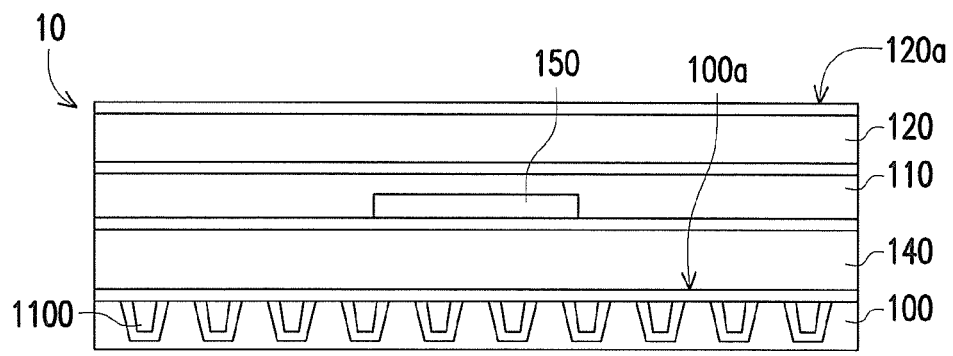

Referring to FIG. 1D, the auxiliary substrate 140 of the electronic device package structure 10 is located on an upper surface 100*a* of the first substrate 100 and under the adhesive material 110 and the electronic device 150.

Figure 1E:
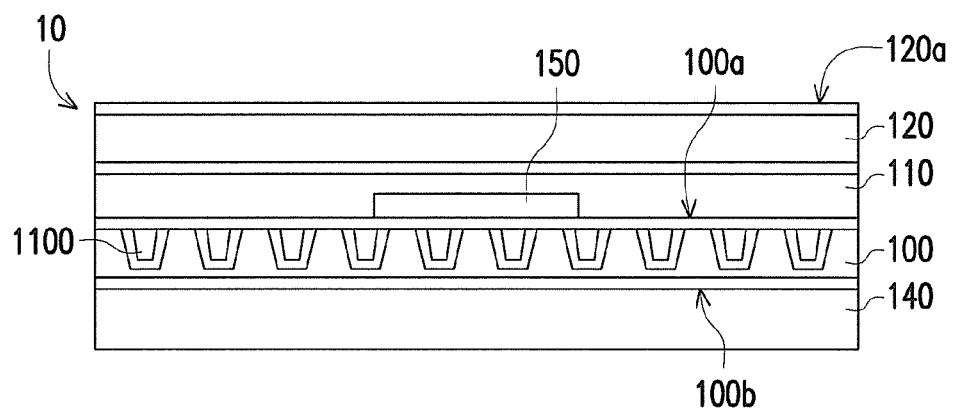

Referring to FIG. 1E, the auxiliary substrate 140 of the electronic device package structure 10 is located on a lower surface 100*b* of the first substrate 100, below the electronic device 150 and under the first substrate 100.

The auxiliary substrate 140 may be adhered onto the second substrate 120 or the first substrate 100 using an adhesive material (not shown). Generally, depending on whether the auxiliary substrate 140 is adhered onto the second substrate or the first substrate, the auxiliary substrate 140 may have an area approximate to that of the substrate where the auxiliary substrate 140 is adhered onto.

In the design of the electronic device package structure 10, at least the first substrate 100 has the gas barrier structure 1100 therein, and the gas barrier structure 1100 is a three-dimensional (3D) structure embedded in the substrate. The gas barrier structure 1100 neither protrudes out of upper surface 100*a* of the first substrate 100 nor protrudes out of the lower surface 100*b* of the first substrate 100, but the gas barrier structure 1100 offers effective gas barrier capability.

Figure 2A:
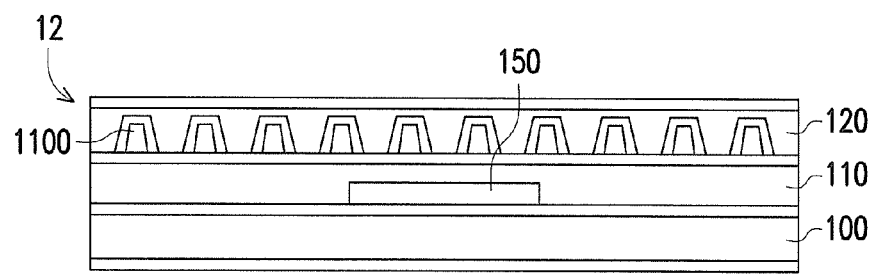
FIGS. 2A-2E are cross-sectional views exemplarily illustrating an electronic device package structure according to embodiments of the disclosure.

FIG. 2A is cross-sectional views exemplarily illustrating an electronic device package structure according to an embodiment of the disclosure. In the present embodiment, a design of a flexible or soft substrate is exemplarily described, but the substrate is not limited to be the flexible or soft substrate. FIG. 2A illustrates an electronic device package structure 12 different from the package structure 10 depicted in FIG. 1A in that the second substrate 120 illustrated in FIG. 2A has a gas barrier structure 1100 disposed in the second substrate 120, i.e., embedded in the second substrate 120, and when the second substrate 120 is adhered to the first substrate 100, the gas barrier structure 1100 is located above the electronic device 150 and between the second substrate 120 and the first substrate 100.

Figure 2B:
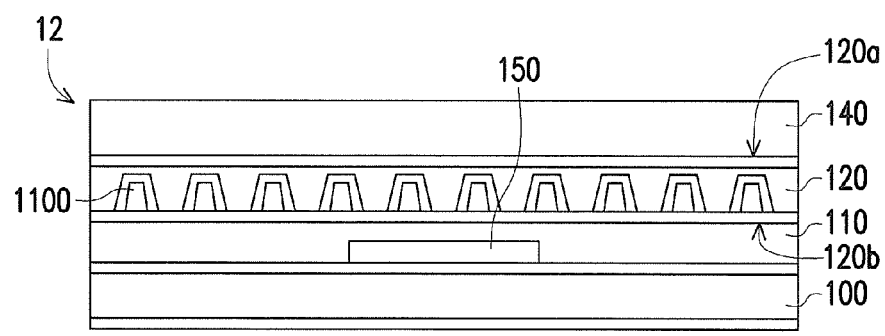

FIGS. 2B-2E are cross-sectional views exemplarily illustrating an electronic device package structure according to embodiments of the disclosure. The electronic device package structure shown in FIGS. 2B-2E are variations of the electronic device package structure shown in FIG. 2A. The electronic device package structure 12 further includes an auxiliary substrate 140, which is a function substrate having a touch function, a color-filtering function, a color conversion and/or polarization function. Referring to FIG. 2B, the auxiliary substrate 140 of the electronic device package structure 12 is located on the upper surface 120*a* of the second substrate 120 and above the second substrate 120 and the electronic device 150.

Figure 2C:
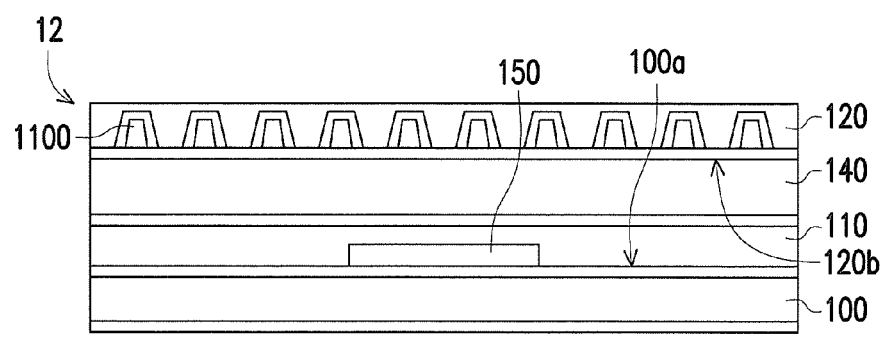

Referring to FIG. 2C, the auxiliary substrate 140 of the electronic device package structure 12 is located on the lower surface 120*b* of the second substrate 120, between the second substrate 120 and the adhesive material 110 and above the electronic device 150.

Figure 2D:
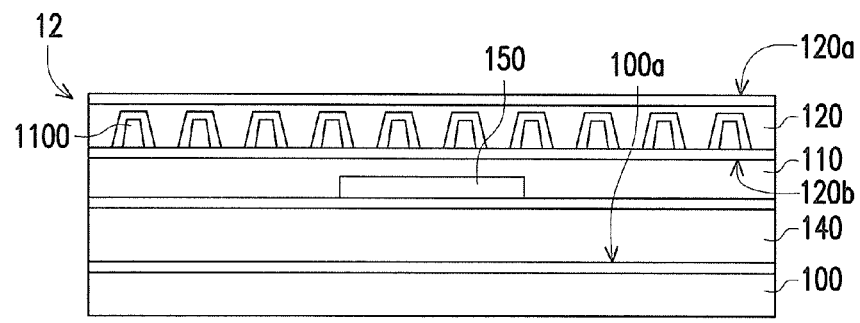

Referring to FIG. 2D, the auxiliary substrate 140 of the electronic device package structure 12 is located on the upper surface 100*a* of the first substrate 100 and under the adhesive material 110 and the electronic device 150.

Figure 2E:
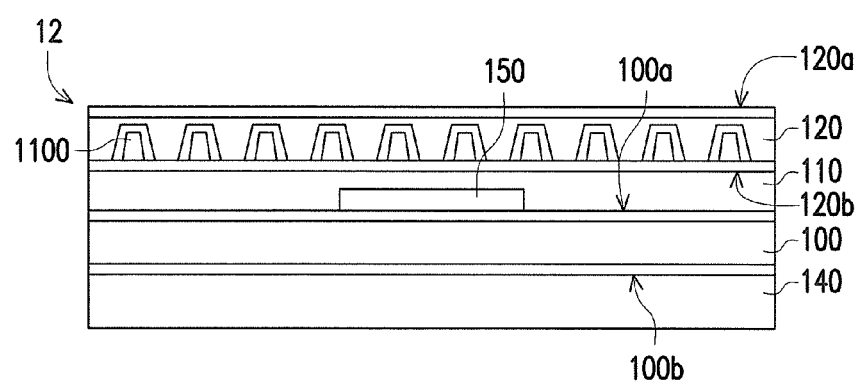

Referring to FIG. 2E, the auxiliary substrate 140 of the electronic device package structure 12 is located on the lower surface 100*b* of the first substrate 100, below the electronic device 150 and under the first substrate 100.

In the design of the electronic device package structure 12, at least the second substrate has the gas barrier structure 1100 therein, and the gas barrier structure 1100 is a 3D structure embedded in the second substrate 120. The gas barrier structure 1100 neither protrudes out of the lower surface 120*b* of the second substrate 120 nor protrudes out of the upper surface 120*a* of the second substrate 120, but the gas barrier structure 1100 offer effective gas barrier effects.

Figure 3A:
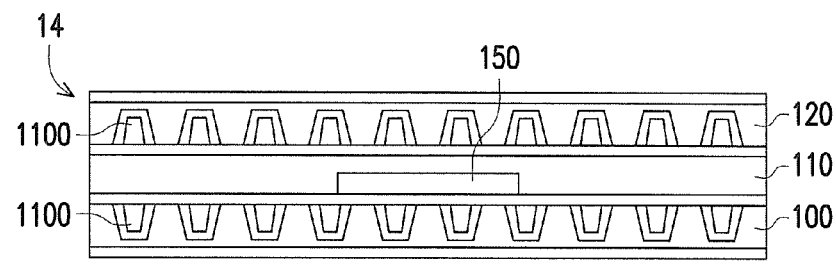
FIGS. 3A-3E are cross-sectional views exemplarily illustrating an electronic device package structure according to embodiments of the disclosure.

FIGS. 3A-3E are cross-sectional views exemplarily illustrating an electronic device package structure according to embodiments of the disclosure. Comparing with the package structure 10 illustrated in FIGS. 1A-1E or the package structure 12 illustrated in FIGS. 2A-2E, FIGS. 3A-3E illustrate an electronic device package structure 14 different from those illustrated in FIGS. 1A-1E and FIGS. 2A-2E in that both the first substrate 100 and the second substrate 120 have gas barrier structures 1100 disposed therein, i.e., the gas barrier structures 1100 are embedded respectively in first substrate 100 and in the second substrate 120. When the second substrate 120 is adhered to the first substrate 100, the electronic device 150 is located between the second substrate 120 and the first substrate 100 and the gas barrier structures 1100 located above and below the electronic device 150 can provide barrier toward gas, as shown in FIG. 3A.

Figure 3B:
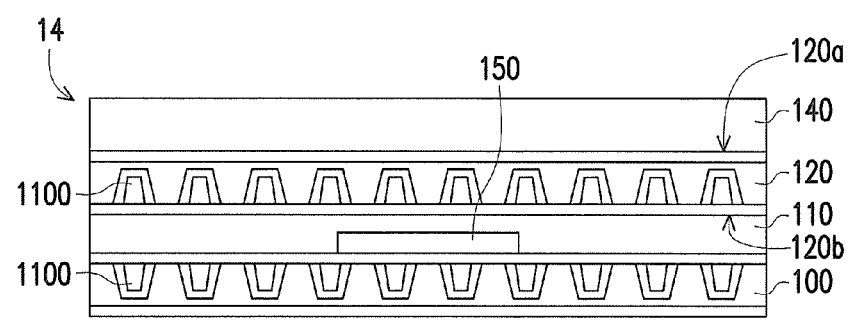

Referring to FIG. 3B, the electronic device package structure 14 further includes an auxiliary substrate 140 which is a function substrate having a touch function, a color-filtering function, a color conversion and/or polarization function. Referring to FIG. 3B, the auxiliary substrate 140 of the electronic device package structure 14 is located on the upper surface 120a of the second substrate 120 and above the second substrate 120 and the electronic device 150.

Figure 3C:
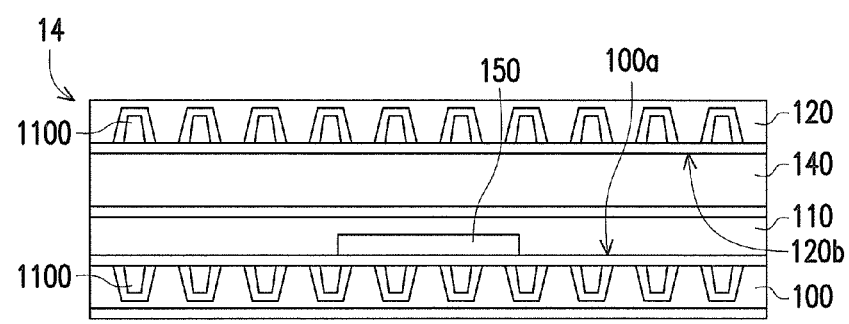

Referring to FIG. 3C, the auxiliary substrate 140 of the electronic device package structure 14 is located on the lower surface 120b of the second substrate 120, between the second substrate 120 and the adhesive material 110, under the electronic device 150 and above the first substrate 100.

Figure 3D:
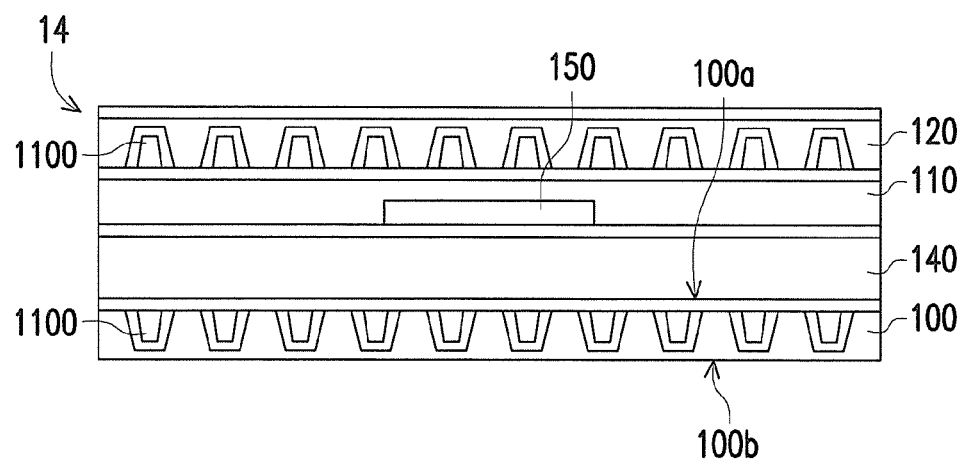

Referring to FIG. 3D, the auxiliary substrate 140 of the electronic device package structure 14 is located on the upper surface 100a of the first substrate 100, under the adhesive material 110 and the electronic device 150 and on the first substrate 100.

Figure 3E:
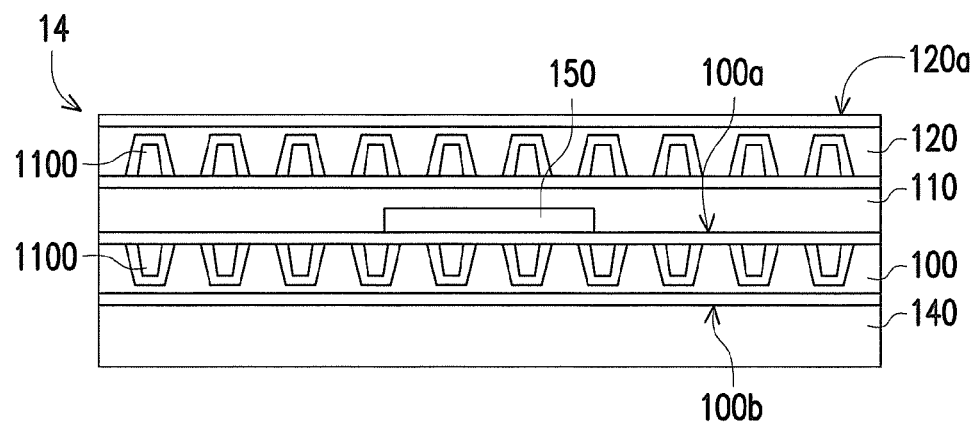

Referring to FIG. 3E, the auxiliary substrate 140 of the electronic device package structure 14 is located on the lower surface 100b of the first substrate 100, under the electronic device 150 and under the first substrate 100.

The electronic device package structure 14 may be a double-side light emitting apparatus, and the first substrate and the second substrate are transparent. If the package structure 14 is configured as a single-side light emitting apparatus, at least one substrate (i.e., either the first or the second substrate) thereof is transparent, while the other substrate may be transparent, non-transparent or designed with a reflective layer, such that light generated from the electronic device 150 may emit from one of the first substrate 100 and the second substrate 120.

FIGS. 4A-4D are cross-sectional views exemplarily illustrating an electronic device package structure according to embodiments of the disclosure. The electronic device package structure respectively illustrated in FIGS. 4A-4D is a simplified implementation of FIG. 1A. An electronic device package structure 16 includes at least one first substrate 100, an electronic device 150 disposed above the first substrate 100 and an adhesive material 110 on the first substrate 100. Comparing with the package structure 10 illustrated in FIGS. 1A-1E, the electronic device package structure 16 does not have a second substrate. The electronic device 150 is located above the first substrate 100, between the adhesive material 110 and the first substrate 100 and encapsulated in the adhesive material 110. The first substrate 100 has a gas barrier structure 1100 disposed inside the first substrate 100, i.e., embedded in the first substrate 100, such that the gas barrier structure 1100 is located under the electronic device 150 and between the adhesive material 110 and the first substrate 100. The electronic device package structure 16 may further include a hard coating layer 160 coated on the adhesive material 110 and used for enhancing the hardness of a multi-layered package body. A material of the hard coating layer 160 may be, for example, colloidal lacquer.

Figure 4A:
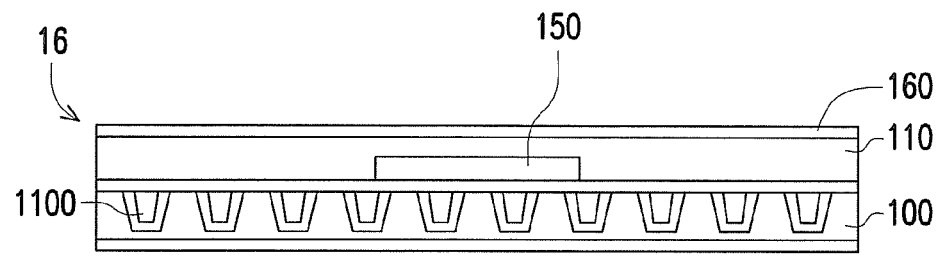
FIGS. 4A-4D are cross-sectional views exemplarily illustrating an electronic device package structure according to embodiments of the disclosure.
Figure 4B:
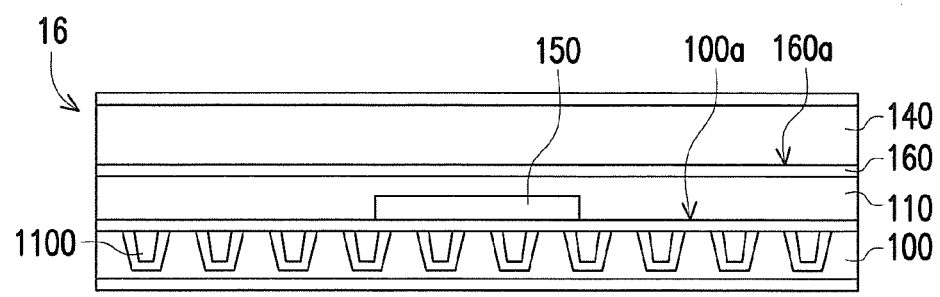
Figure 4C:
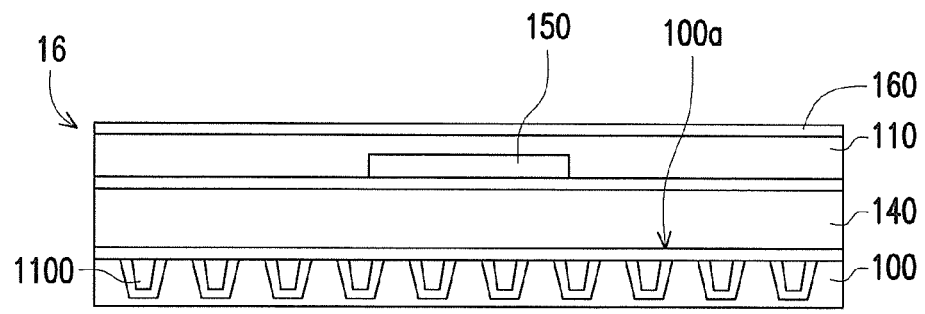
Figure 4D:
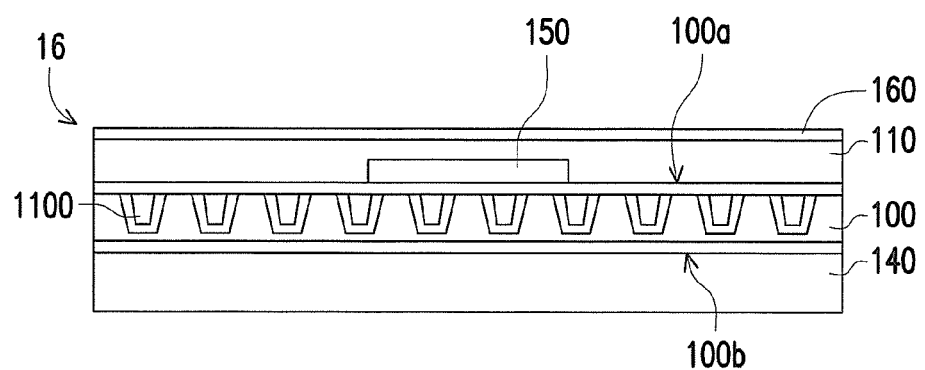

The electronic device package structure illustrated in FIGS. 4B-4D are structural variations of the electronic device package structure shown in FIG. 4A. The electronic device package structure 16 may further include an auxiliary substrate 140 which is a function substrate having a touch function, a color-filtering function, a color conversion and/or polarization function. Referring to FIGS. 4B-4D, the auxiliary substrate 140 of the electronic device package structure 16 may be located on an upper surface 160a of the hard coating layer 160 on the adhesive material 110 (with reference to FIG. 4B), or located above the upper surface 100a of the first substrate 100 and between the first substrate 100 and the electronic device 150 (with reference to FIG. 4C). The auxiliary substrate 140 is located on the lower surface 100b of the first substrate 100 and under the electronic device 150 (with reference to FIG. 4D).

FIGS. 5A-5E are enlarged cross-sectional views exemplarily illustrating a part of the substrate having the gas barrier structure according to embodiments of the disclosure. The substrate 100 or the substrate 120 has at least one gas barrier structure 5100 disposed therein. The gas barrier structure 5100 is formed by stacking multiple layers of various types of materials. For example, referring to FIG. 5A, the gas barrier structure 5100 at least includes a soft core 5110 and a flexible passivation layer 5120 and a soft layer 5130, wherein the flexible passivation layer 5120 and the soft layer 5130 are alternately stacked with each other. The alternately stacked flexible passivation layer 5120 and soft layer 5130 conformally cover the soft core 5110 to form a three-dimensional (3D) structure having a cross-section substantially presented in a trapezoid, for example, but the disclosure is not limited thereto.

In FIGS. 5B-5E, in addition to the soft core 5110 and the alternately stacked flexible passivation layer 5120 and soft layer 5130, the gas barrier structure further includes at least one getter layer 5140. In a gas barrier structure 5100B illustrated in FIG. 5B, on the soft core 5110, for example, the flexible passivation layer 5120, the soft layer 5130, the getter layer 5140, the soft layer 5130 and the flexible passivation layer 5120 may be stacked in sequence. In this scenario, the getter layer 5140 may be located between two soft layers 5130 and the flexible passivation layer 5120 may be the outermost layer.

In a gas barrier structure 5100C illustrated in FIG. 5C, on the soft core 5110, for example, the getter layer 5140, the soft layer 5130, the flexible passivation layer 5120, the soft layer 5130 and the flexible passivation layer 5120 are stacked in sequence. In this scenario, the getter layer 5140 may be located between the soft core 5110 and the soft layer 5130, and the flexible passivation layer 5120 may be the outermost layer.

In a gas barrier structure 5100D illustrated in FIG. 5D, on the soft core 5110, for example, the getter layer 5140, the soft layer 5130, the getter layer 5140, the soft layer 5130 and the flexible passivation layer 5120 are stacked in sequence. In this scenario, the getter layer 5140 may be located between the soft core 5110 and the soft layer 5130 or between two soft layers 5130, and the flexible passivation layer 5120 may be the outermost layer.

The gas barrier structure may also include two types of stacking designs. Referring to FIG. 5E, the design of the gas barrier structure includes, for example, the 3D structure of the gas barrier structure 5100 illustrated in FIG. 5A and the 3D structure of the gas barrier structure 5100D illustrated in FIG. 5D, and the two types of structures may be alternately disposed. The design of the gas barrier structure may be adjusted or modified according to different gas barrier requirements of various positions for the package structure (e.g. depending on how long the distance from the position to a chip or an electronic device is or depending on whether the position is adjacent to an edge or not). The gas barrier structure can effectively stop moisture and oxygen from directly contacting the electronic device or at least prolong the permeation path for moisture and oxygen to the electronic device.

The soft core 5110 or the soft layer 5130 may be made of small molecule materials, organic oligomers, organic-inorganic co-evaporation materials or inorganic metal oxide materials. The small molecules may have a molecular weight ranging from 10 g/mol to 2,000 g/mol and may be selected from, for example, tris(8-hydroxyquinoline)-aluminum(Alq3),N,N'-bis(naphthalene-1-yl)-N,N'-diphenyl-b enzidine (NPB) or phthalocyanine copper complex (CuPc). The organic oligomers have a molecular weight ranging from 500 g/mol to 3,000 g/mol and may be phenylene vinylene oligomers and fluorene oligomers. The organic-inorganic co-evaporation materials may be obtained by co-evaporation of the aforementioned organic materials and metal materials and have a molecular weight ranging from 3 g/mol to 500 g/mol.

The metal materials may be, for example. Al, Ag, Au, Be, Cr, Cu, Co, Fe, Ge, Ir, In, Mo, Mn, Mg, Ni, Nb, Pb, Pd, Pt, Ru, Rh, Sn, Si, Sb, Se, Ti, Ta, Te, V, W, Zr, Zn, Mg/Ag, Al/Ag, Al/Si, Al/Si/Cu, Au/Ge, Au/Be, Au/Ge/Ni, Ni/Cr, Pb/Sn or In/Sn.

The inorganic metal oxide materials may be $Al_2O_3$, AlN, $BaTiO_3$, $CeO_2$, $Cr_2O_3$, CuO, $Dy_2O_3$, $Er_2O_3$, $Eu_2O_3$, $Ga_2O_3$, $GeO_2$, $HfO_2$, $Ho_2O_3$, $In_2O_3$, indium tin oxide (ITO), $PbTiO_3$, MgO, $MnO_2$, $Nd_2O_3$, NiO, $Nb_2O_5$, $Pr_2O_3$, $Sm_2O_3$, $SiO_2$, SiO, $Ta_2O_5$, $ThO_2$, $SnO_2$, $TiO_2$, $Y_2O_3$, ZnO, $ZrO_2$, CdTe, ZnTe, CdSe, CdS, ZnS, $MoS_2$, $BaF_2$, $MgF_2$, $CaF_2$Li, MgP, LiF, $Li_2O$, CaO or MgO.

A material of the flexible passivation layer 5120 may be selected from the inorganic metal oxide materials or the metal materials. The metal materials may be Al, Ag, Mg, Mg—Ag alloy or Mg—Al alloy, the inorganic metal oxide materials may be, for example, indium tin oxide (ITO), Al-doped ZnO (AZO), indium-zinc-tin oxide (IZO), $WO_3$, $MoO_3$, SiOx, SiNx, SiOxNy, and $Al_2O_3$, and a material of the getter layer 5140 may be alkali metal/alkaline earth metal halides (e.g. LiF, NaF, CsF, $MgF_2$, $CaF_2$, NaCl, KCl, RbCl, $MgCl_2$ or $CaCl_2$), alkali metal/alkaline earth metal oxide compounds (e.g. $Li_2O$, $Cs_2O$, MgO, CaO, $LiBO_2$ or $K_2SiO_3$), alkali metal/alkaline-earth metal carbonate (e.g. $Li_2CO_3$, $Na_2CO_3$ or $Cs_2CO_3$ or alkali metal acetate (e.g. $CH_3COOM$ (M=Li, Na, K, Rb or Cs)).

Figure 6A:
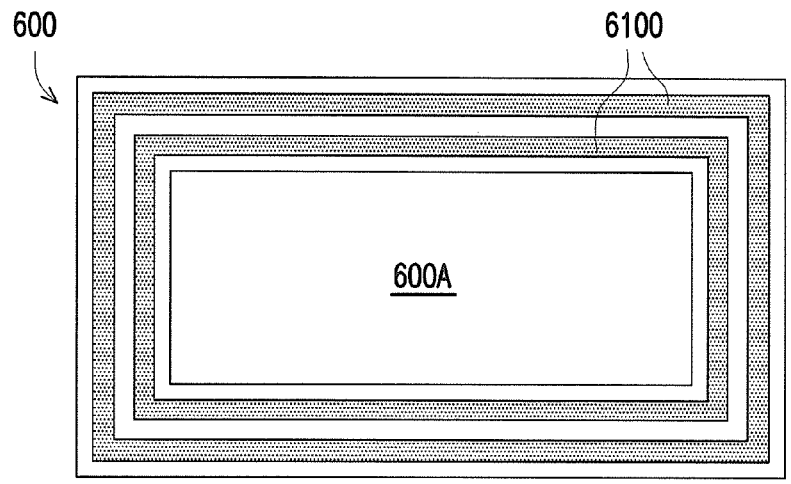
FIGS. 6A-6F are top views exemplarily illustrating a substrate having gas barrier structures according to embodiments of the disclosure.
Figure 6B:
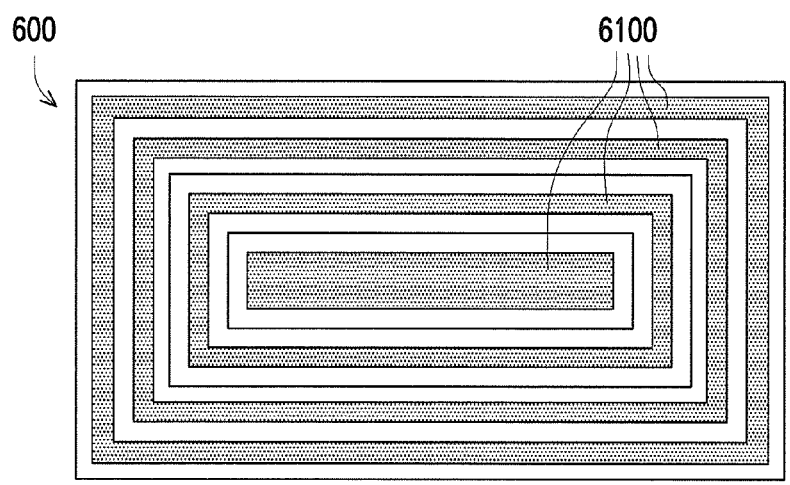
Figure 6C:
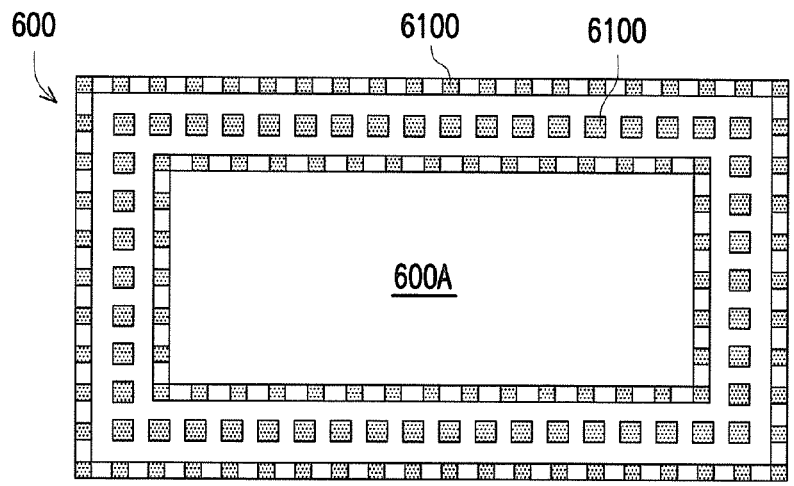
Figure 6D:
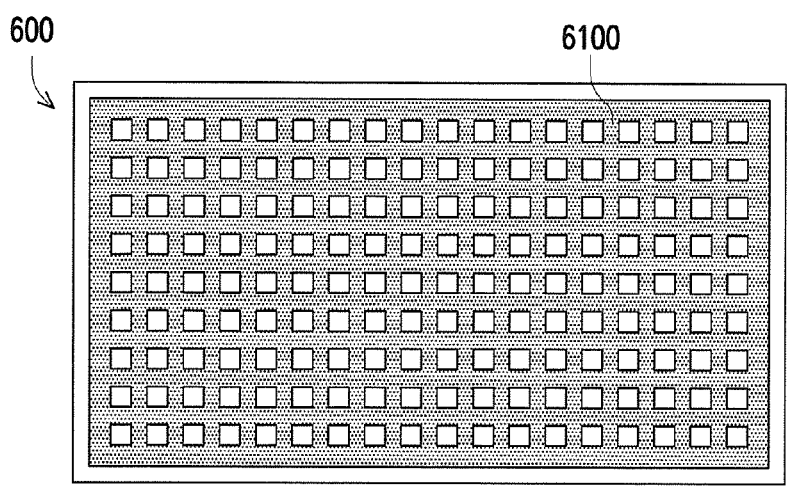
Figure 6E:
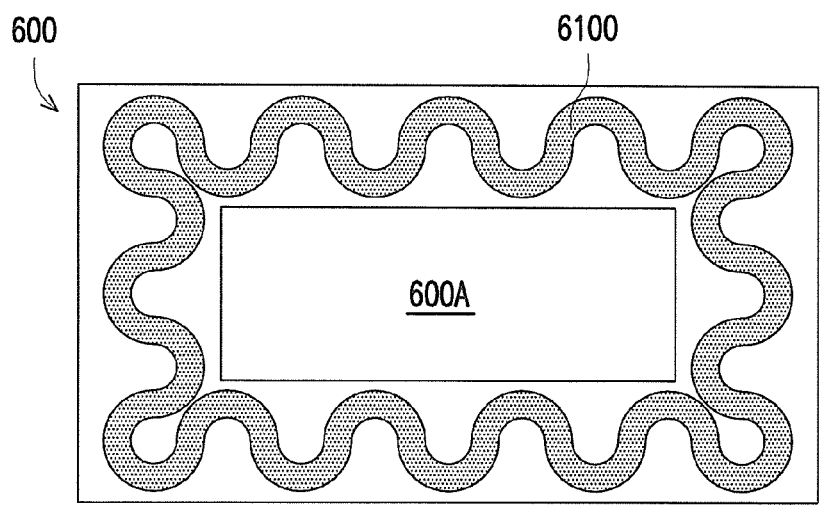
Figure 6F:
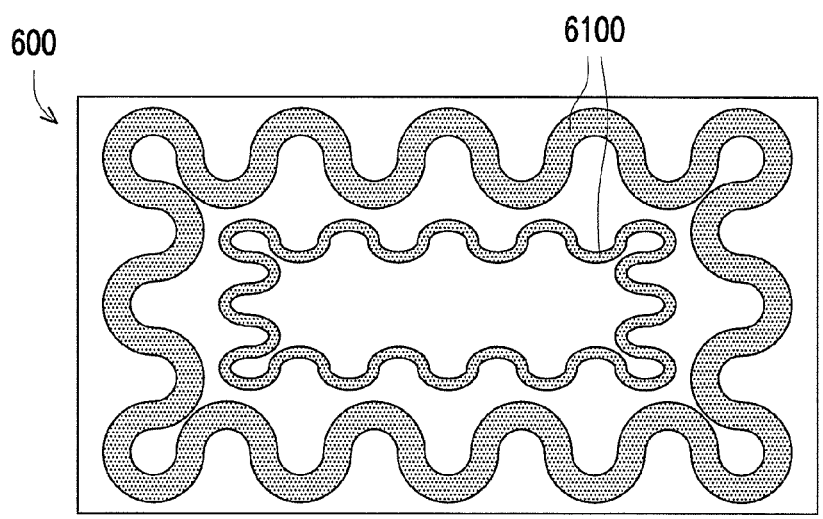

FIGS. 6A-6F are top views exemplarily illustrating a substrate having a gas barrier structure according to embodiments of the disclosure. A gas barrier structure 6100 may be configured to have a specific pattern and embedded in a substrate 600. Referring to FIGS. 6A, 6C and 6E, when the gas barrier structure 6100 is disposed in a substrate having an electronic device mounted thereon, the gas barrier structure 6100 is disposed around or surrounding an element disposing region (a region where the electronic device is disposed) 600A. In an embodiment where the element disposing region 600A is located in the center of the substrate 600, the gas barrier structure(s) 6100 is disposed in the peripheral portion of the substrate 600. FIG. 6A illustrates gas barrier structures 6100, for example, shaped as closed rings or frames (when being viewed from the top) and arranged with equal or unequal intervals in a concentric manner. That is, the gas barrier structures 6100 surround the element disposing region 600A located in the center and are distributed in the substrate 600 concentrically. In FIG. 6C, the gas barrier structures 6100, in the form of discontinuous blocks, are distributed in the substrate 600, for example, in a circle pattern (when being viewed from the top) surrounding the element disposing region 600A located in the center. The size of each gas barrier structure (each block) ranges, for example, from 1 mm to 100 mm. FIG. 6E illustrates a gas barrier structure 6100, for example, distributed in the substrate 600 in a continuous pattern (continuous wave curve when being viewed from the top) and surrounding the element disposing region 600A located in the center. Comparing with FIGS. 6A, 6C and 6E, FIGS. 6B, 6D and 6F illustrate similar configurations of the gas barrier structure(s) without the electronic device mounted on the substrate or the element disposing region, so that the gas barrier structure(s) or the pattern thereof may designed to be distributed over the entire substrate to achieve even higher gas barrier capability and higher blocking effects. FIGS. 6B and 6E illustrate gas barrier structures 6100, for example, shaped as square rings (frames) or wavy rings (when being viewed from the top) distributed in the substrate 600 and arranged outward with equal or unequal intervals in a concentric manner. In FIG. 6D, the gas barrier structure 6100, for example, is distributed in the substrate 600 in a continuous grid pattern (when being viewed from the top). For the substrate having the central element disposing region, the design of the continuous grid pattern may be modified to be a continuous grid frame pattern surrounding the central element disposing region. Alternatively, through the reverse design, the gas barrier structures 6100 may be designed as discontinuous blocks distributed over the substrate 600.

In the present embodiment, the gas barrier structures 6100 are disposed, for example, surrounding the element disposing region 600A. Thus, the moisture and gas barrier capability at all lateral sides of the package structure of the electronic device may be effectively enhanced. The package structure of the electronic device has good moisture and gas barrier capability. In the present embodiment, the gas barrier structure(s) is located in the periphery region surrounding the central element disposing region. However, in other embodiments based on the spirit of the disclosure, the gas barrier structure may only surround at least one side (e.g. one, two or three sides) of the element disposing region, which depends on the requirements of the package structure design.

The design of the gas barrier structure of the disclosure is not limited to the aforementioned geometrical patterns, sizes and quantities as illustrated. In the present embodiment, examples where the gas barrier structure has continuous patterns are illustrated for description; however, in other embodiments, the gas barrier structure may consist of a plurality of continuous or discontinuous gas barrier structures. Additionally, in the present embodiment, examples where one or more gas barrier structures are illustrated for description. Therein, the design of the gas barrier structures may be adjusted depending on the difference of positions or electronic devices to be packaged. Moreover, any combinations of various stack structures (different cross-sectional structures) and pattern designs may be adopted for different electronic device package structures.

Figure 7A:
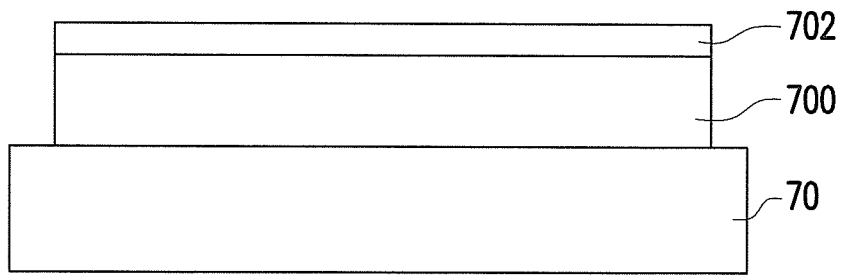
FIGS. 7A-7D are cross-sectional schematic views exemplarily illustrating respective steps of a method for manufacturing a substrate having gas barrier structures according to an embodiment of the disclosure.

FIGS. 7A-7D are cross-sectional schematic views exemplarily illustrating respective steps of a method for manufacturing a substrate having one or more gas barrier structures according to an embodiment of the disclosure. Referring to FIG. 7A, a substrate 700 is first provided, wherein the substrate 700 is, for example, a flexible substrate (e.g. a polyimide substrate) mounted on a carrier 70. A photoresist layer 702 is formed over the substrate 700.

Figure 7B:
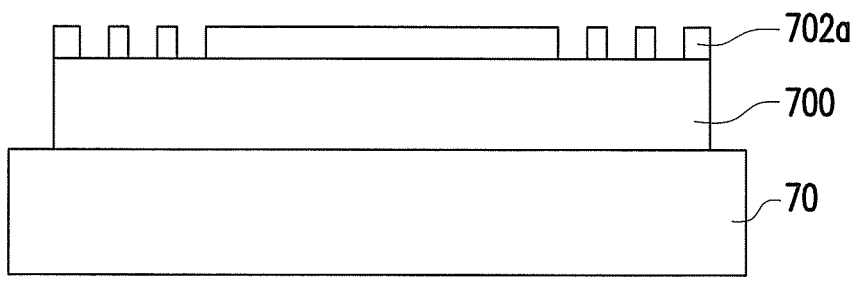
Figure 7C:
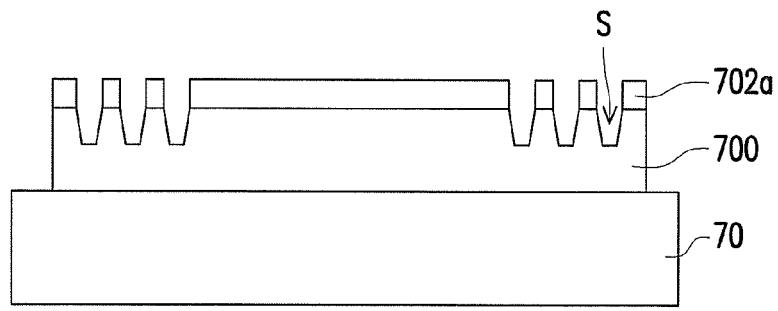

Referring to FIG. 7B, the photoresist layer 702 is patterned by, for example, a lithography etching process to form a patterned photoresist layer 702a. Referring to FIG. 7C, the substrate 700 is etched by using the patterned photoresist layer 702a as an etching mask to form a plurality of trenches S. The etching process may include a dry etching or a wet etching process. A depth of the trenches S ranges, for example, from 200 µm to 300 µm, and an interval between the trenches S ranges, for example, from 200 µm to 300 µm.

Figure 7D:
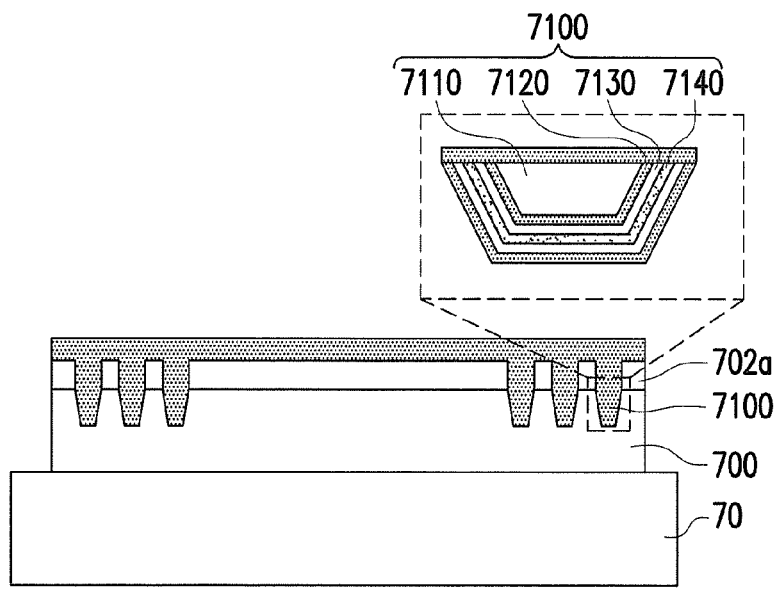

Referring to FIG. 7D, different gas barrier materials are deposited in sequence. The gas barrier materials include the materials used for the getter layer, the soft layer and the flexible passivation layer described in the aforementioned embodiments, and the gas barrier materials are formed by semiconductor manufacturing techniques, such as a chemical deposition method, an evaporation method and so on according to requirements for different materials. Multiple layers of different gas barrier materials are generally deposited conformal to the shape of the trenches S and altogether fill up the trenches S to form the gas barrier structure(s) 7100. Consistent with the pattern and the depth of the trenches S, the pattern and the size of the gas barrier structure 7100 may be determined. For example, steps of forming the gas barrier structures 7100 to fill the trenches S include conformally depositing at least one flexible passivation layer 7120, conformally depositing at least one soft layer 7130 and depositing and forming a soft core 7110 to form the gas barrier structure 7100. The step of the gas barrier structure 7100 filling the trenches S may further include depositing at least one getter layer 7140 so as to be alternately stacked with the flexible passivation layer 7120 and the soft layer 7130 around the soft core. Following the above steps, a planarization layer (not shown) may be formed to cover the topmost of the gas barrier structure for planarization. The planarization process is a common choice in the manufacturing process and thus will be no longer repeatedly described.

Figure 8A:
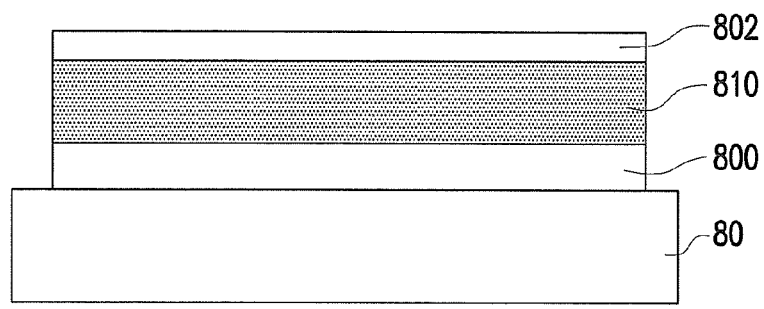
FIGS. 8A-8D are cross-sectional schematic views exemplarily illustrating respective steps of a method for manufacturing a substrate having gas barrier structures according to another embodiment of the disclosure.

FIGS. 8A-8D are cross-sectional schematic views exemplarily illustrating respective steps of a method for manufacturing a substrate having one or more gas barrier structures according to another embodiment of the disclosure. Referring to FIG. 8A, a substrate 800 is provided, wherein the substrate 800 is, for example, a flexible substrate (e.g. a polyimide substrate) mounted on the carrier 80. A gas barrier layer 810 (e.g. a SiOx layer or a SiNx layer) is formed on the substrate 800 and a photoresist layer 802 is formed over the gas barrier layer 810. The gas barrier layer 810 described herein may be a composite material formed by stacking multiple layers of different gas barrier materials or may be a layer of a single material. The technique utilized for forming the gas barrier layer may refer to the embodiments above.

Figure 8B:
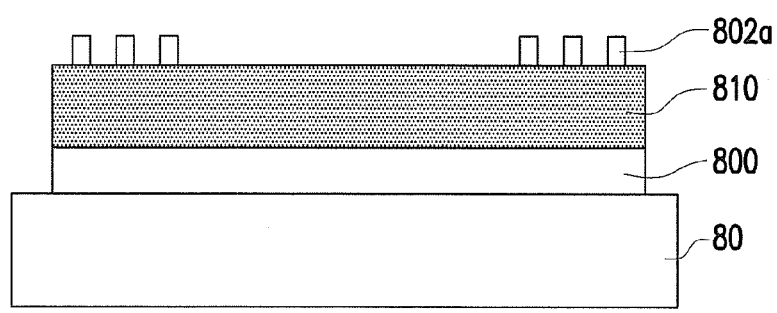
Figure 8C:
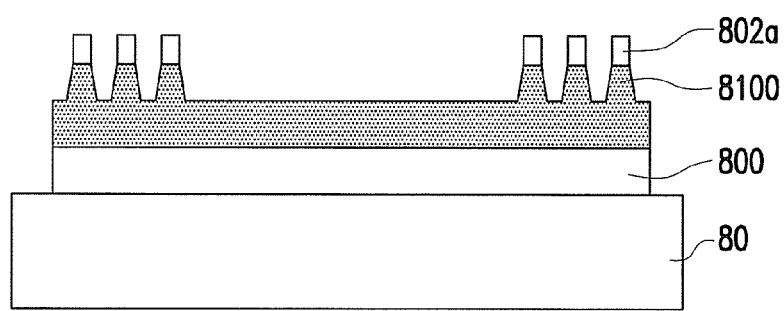
Figure 8D:
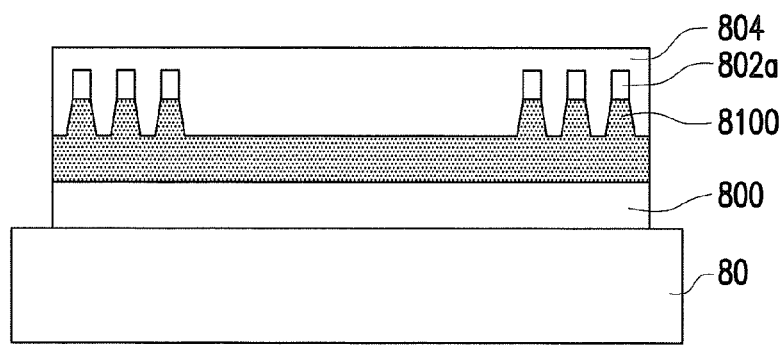

Referring to FIG. 8B, the photoresist layer 802 is patterned by using a lithography etching process to form a patterned photoresist layer 802a. Referring to FIG. 8C, by using the patterned photoresist layer 802a as an etching mask, the gas barrier layer 810 is etched by patterning gas barrier layer 810 to form a gas barrier structure 8100. Referring to FIG. 8D, another substrate 804 is formed on the substrate 800, such that the gas barrier structure 8100 is wrapped between the substrates 800 and 804. The substrate 804 is, for example, a flexible substrate (e.g. a polyimide substrate).

Figure 9A:
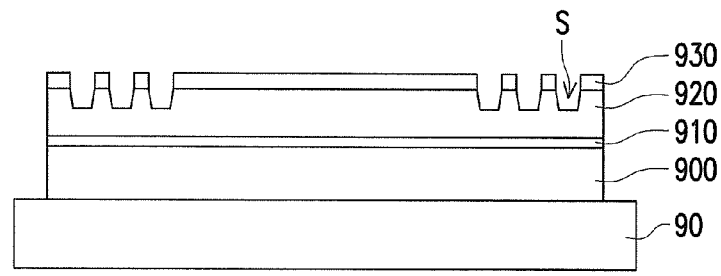
FIGS. 9A-9E are cross-sectional schematic views exemplarily illustrating respective steps of a method for manufacturing a package structure with the substrate having gas barrier structures according to an embodiment of the disclosure.

FIGS. 9A-9E are cross-sectional schematic views exemplarily illustrating respective steps of a method for manufacturing a package structure with the substrate having gas barrier structures according to an embodiment of the disclosure. Referring to FIG. 9A, a substrate 900 mounted on a carrier 90 is firstly provided. A gas barrier layer 910 (e.g. a SiOx layer or a SiNx layer), another substrate 920 and another gas barrier layer 930 (e.g. a SiOx layer or a SiNx layer) are disposed on the substrate 900. The substrate 920 and the gas barrier layer 930 have a plurality of trenches S formed therein. Here, the substrate 900 or 920 is, for example, a flexible substrate (e.g. a polyimide substrate), which may be formed by directly coating and then solidifying (curing). The gas barrier layers 910 and 930 may be composite materials formed by stacking multiple layers of different gas barrier materials or may be a single layer of a single material. The substrate 920 and the gas barrier layer 930 may be patterned by using a lithography etching process to form the trenches S. For example, a photoresist pattern (not shown) may be formed on the gas barrier layer 930, and the gas barrier layer 930 and the substrate 920 are etched by using the photoresist pattern as a mask to form a plurality of trenches S therein. The gas barrier layer 930 with the pattern of the trenches S, that is, the patterned gas barrier layer, may be considered as a gas barrier structure. The technique utilized for forming the gas barrier layer may refer to the embodiments above. The lithography etching process steps and the manufacturing method is a common technique in the art and thus, will be no longer repeatedly described.

Figure 9B:
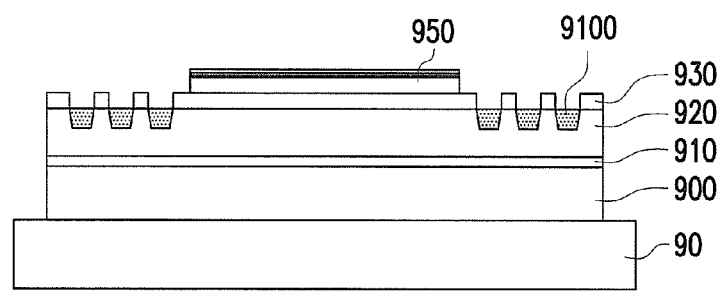

Referring to FIG. 9B, an adhesive material 9100 is formed, and the trenches S may be partially or approximately filled by the adhesive material 9100. Afterward, a planarization layer (not shown) may be further formed to cover the top of the gas barrier structure for planarization. Then, an electronic device 950 is disposed above the substrate 920 and on the gas barrier layer 930 (within the element disposing region). The electronic device 950 is, for example, an active environmental sensitive display element, such as an active matrix organic light emitting diode (AM-OLED), or a passive environmental sensitive element display element, such as a passive matrix organic light emitting diode (PM-OLED).

Figure 9C:
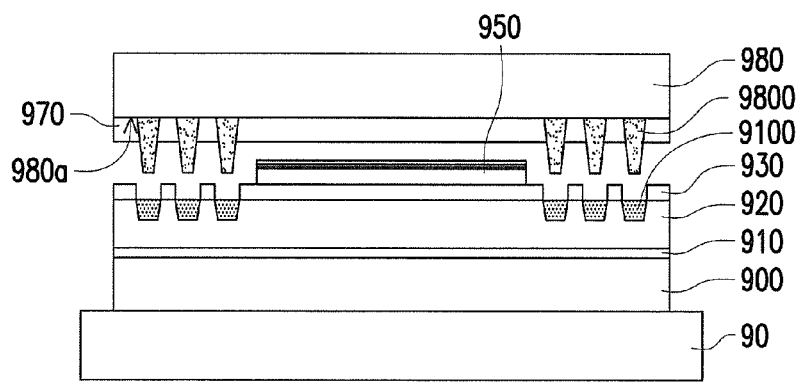

Referring to FIG. 9C, an upper cover 980 is provided, and the upper cover 980 has gas barrier structures 9800 protruding from a surface 980a thereof. The upper cover 980 is, for example, a flexible substrate, and the gas barrier structures 9800 is protrudently formed on the surface 980a. Differing from the aforementioned embodiment(s), the gas barrier structures 9800 is not embedded in the upper cover 980 but protrudes out of the surface 980a of the upper cover 980. Except this, the gas barrier structures 9800 are not much different from other structures, and thus, details of pattern structures, materials and the fabrication techniques for the gas barrier structures 9800 may refer to the embodiments above. Moreover, an adhesive material 970 is disposed on the upper cover 980, and the adhesive material 970 may have an area approximately identical to that of the upper cover 980.

Figure 9D:
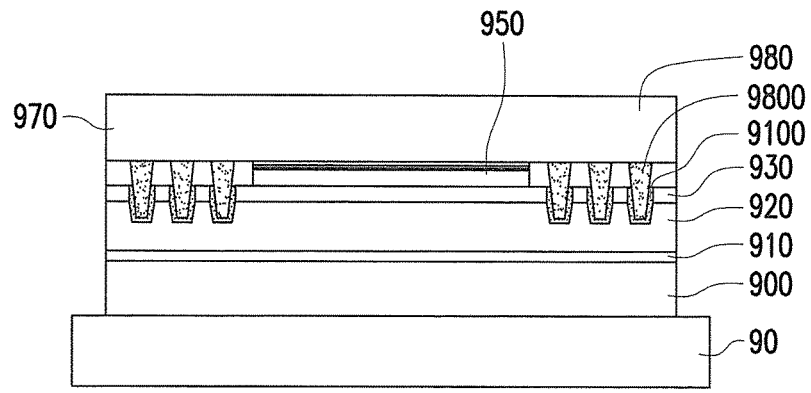

Referring to FIG. 9D, the upper cover 980 is adhered to the substrate 920, i.e., the upper cover 980 is adhered to the substrate 920 by using the adhesive material 970. The protrudent gas barrier structures 9800 of the upper cover 980 are inserted into the adhesive material 9100 of the substrate 920, such that the electronic device 950 is disposed between the substrate 920 and the upper cover 980.

Figure 9E:
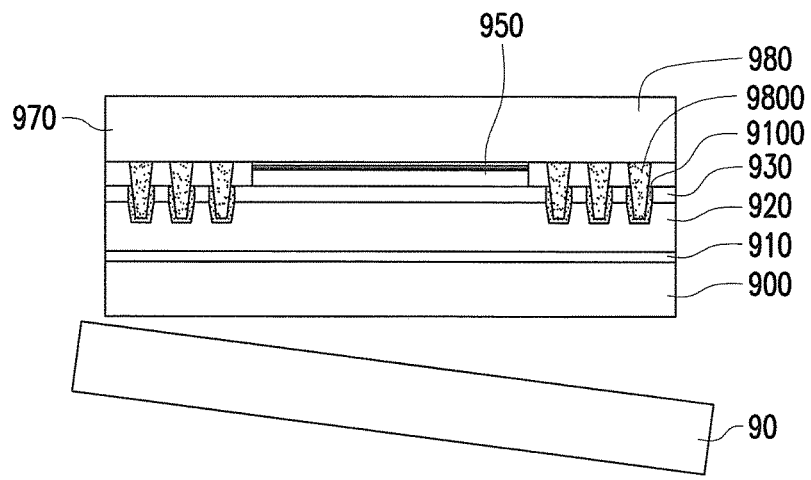

Then, referring to FIG. 9E, the carrier 90 is removed.

The electronic device package structure of the disclosure may be further electrically connected to a flexible circuit board or a printed circuit board (PCB).

To sum up, the electronic device package structure of the embodiments of the disclosure includes embedded 3D barrier structures surrounding the element disposing region and protecting the electronic device disposed in the element disposing region. Since the barrier structures can effectively stop the permeation of moisture and oxygen from the outer environment, the life of the electronic device may be effectively prolonged. Additionally, the electronic device package structure of the disclosure may further adopt the adhesive material and/or other flexible substrate having the gas barrier function to strengthen the gas barrier capability of the peripheral portion of the package structure. Through the design of the embodiments of this disclosure, moisture and oxygen are stopped from contacting the electronic device located in the element disposing region or the permeation path for moisture and oxygen entering therein can be effective extended. Accordingly, the reliability of the electronic device is effectively improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A package structure of an electronic device, comprising:
    a first substrate, having a first surface and a second surface opposite to the first surface;
    an electronic device, disposed on the first surface of the first substrate;
    an adhesive material, disposed on the first substrate and covering the electronic device and the first surface of the first substrate; and
    a second substrate, disposed above the first substrate and the adhesive material, wherein the second substrate has a third surface and a fourth surface opposite to the third surface,
    wherein at least one of the first substrate and the second substrate has a gas barrier structure embedded therein, and the first substrate and the second substrate are adhered to each other through the adhesive material, such that the electronic device is located between the first substrate and the second substrate, and the electronic device is disposed on the gas barrier structure that is embedded within the at least one of the first substrate and the second substrate without protruding out of the first and second surfaces of the first substrate and without protruding out of the third and fourth surfaces of the second substrate.

2. The package structure according to claim 1, further comprising:
    at least one functional substrate, located on the second surface of the first substrate and under the electronic device and under the first substrate,
    wherein the functional substrate is a substrate having a touch function, a substrate having a color-filtering function, a substrate having a color conversion function or a substrate having a polarization function.

3. The package structure according to claim 1, further comprising:
    at least one functional substrate, located on the first surface of the first substrate and under the electronic device and above the first substrate,
    wherein the functional substrate is a substrate having a touch function, a substrate having a color-filtering function, a substrate having a color conversion function or a substrate having a polarization function.

4. The package structure according to claim 1, further comprising:
    at least one functional substrate, located on the fourth surface of the second substrate, above the electronic device, between the adhesive material and the second substrate and under the second substrate,
    wherein the functional substrate is a substrate having a touch function, a substrate having a color-filtering function, a substrate having a color conversion function or a substrate having a polarization function.

5. The package structure according to claim 1, further comprising:
    at least one functional substrate, located on the third surface of the second substrate, above the electronic device and the adhesive material and above the second substrate,
    wherein the functional substrate is a substrate having a touch function, a substrate having a color-filtering function, a substrate having a color conversion function or a substrate having a polarization function.

6. The package structure according to claim 1, wherein the electronic device includes an active matrix organic light emitting diode (OLED) element or a passive matrix OLED element.

7. The package structure according to claim 1, wherein the first substrate or the second substrate is a flexible substrate, and a material of the first substrate or the second substrate comprises polyethylene terephthalate, polyethylene naphthalate, polyethersulfone, polymethyl methacrylate, polycarbonate, polyimide or a metal foil.

8. The package structure according to claim 1, wherein a material of the adhesive material comprises acrylic resin, epoxy resin or silicone.

9. The package structure according to claim 1, wherein the gas barrier structure at least comprises a three-dimensional (3D) structure formed with a soft core and at least one flexible passivation layer and at least one soft layer alternately stacked on and covering the soft core, and the gas barrier structure is embedded in the first substrate and/or the second substrate.

10. The package structure according to claim 9, wherein the gas barrier structure further comprises at least one getter layer alternately stacked on the soft core with the at least one flexible passivation layer and the at least one soft layer.

11. The package structure according to claim 9, wherein a material of the soft core or the at least one soft layer comprises small molecule materials, organic oligomers, organic-inorganic co-evaporation materials or inorganic metal oxide materials.

12. The package structure according to claim 11, wherein the small molecule materials comprise tris(8-hydroxyquinoline)-aluminum (Alq3), N,N'-bis(naphthalene-1-yl)-N,N'-diphenyl-benzidine (NPB) or phthalocyanine copper complex (CuPc).

13. The package structure according to claim 11, wherein the organic oligomers comprise phenylene vinylene oligomers or fluorene oligomers.

14. The package structure according to claim 11, wherein a molecular weight of the organic-inorganic co-evaporation materials ranges from 3 g/mol to 500 g/mol.

15. The package structure according to claim 11, wherein the inorganic metal oxide materials comprise $Al_2O_3$, AlN, $BaTiO_3$, $CeO_2$, $Cr_2O_3$, CuO, $Dy_2O_3$, $Er_2O_3$, $Eu_2O_3$, $Ga_2O_3$, $GeO_2$, $HfO_2$, $Ho_2O_3$, $In_2O_3$, indium tin oxide (ITO), $PbTiO_3$, MgO, $MnO_2$, $Nd_2O_3$, NiO, $Nb_2O_5$, $Pr_2O_3$, $Sm_2O_3$, $SiO_2$, SiO, $Ta_2O_5$, $ThO_2$, $SnO_2$, $TiO_2$, $Y_2O_3$, ZnO, $ZrO_2$, CdTe, ZnTe, CdSe, CdS, ZnS, $MoS_2$, $BaF_2$, $MgF_2$, $CaF_2Li$, MgP, LiF, $Li_2O$, CaO or MgO.

16. The package structure according to claim 9, wherein a material of the flexible passivation layer comprises Al, Ag, Mg, Mg—Ag alloys, Mg—Al alloys, indium tin oxide (ITO), Al-doped ZnO (AZO), indium-zinc-tin oxide (IZO), $WO_3$, $MoO_3$, SiOx, SiNx, SiOxNy or $Al_2O_3$.

17. The package structure according to claim 9, wherein the gas barrier structure comprises a continuous pattern disposed surrounding a region where the electronic device is disposed.

18. The package structure according to claim 17, wherein the continuous pattern of the gas barrier structure is a frame pattern, a grid pattern, a curve pattern or a combination thereof.

19. The package structure according to claim 9, wherein the gas barrier structure is in a form of discontinuous blocks arranged around a region where the electronic device is disposed or distributed throughout the first or the second substrate.

20. A method for manufacturing a package structure of an electronic device, comprising:
providing a substrate mounted on a carrier;
patterning the substrate and forming a plurality of trenches in the substrate;
forming a gas barrier structure to fill the plurality of trenches; and
disposing the electronic device on the gas barrier structure.

21. The method according to claim 20, wherein a depth of the plurality of trenches ranges from 200 µm to 300 µm, and an interval between the plurality of trenches ranges from 200 µm to 300 µm.

22. The method according to claim 20, wherein the substrate is a flexible substrate, and a material of the substrate comprises polyethylene terephthalate, polyethylene naphthalate, polyethersulfone, polymethyl methacrylate, polycarbonate, polyimide or a metal foil.

23. The method according to claim 20, wherein the step of forming the gas barrier structure to fill the plurality of trenches comprises:
depositing at least one flexible passivation layer, depositing at least one soft layer and depositing a soft core to form the gas barrier structure, such that the gas barrier structure comprises a 3D structure formed with the soft core and the at least one flexible passivation layer and the at least one soft layer alternately stacked on and covering the soft core, and the gas barrier structure is embedded in the trenches of the substrate.

24. The method according to claim 23, wherein the step of forming the gas barrier structure to fill the plurality of trenches further comprises:
depositing at least one getter layer, alternately stacked with the flexible passivation layer and the soft layer to cover the soft core.

25. A method for manufacturing a package structure of an electronic device, comprising:
providing a first substrate mounted on a carrier;
forming a first gas barrier layer on the first substrate;
patterning the first gas barrier layer and forming a plurality of trenches in the first gas barrier layer and defining a first gas barrier structure on the first substrate;
forming a second substrate to cover the first substrate and the first gas barrier structure, wherein the second substrate fills the trenches in the first gas barrier layer; and
disposing the electronic device on the first gas barrier structure.

26. The method according to claim 25, wherein the step of forming the plurality of trenches in the first gas barrier layer comprises etching through the first gas barrier layer and removing a part of the first substrate to form the plurality of the trenches in the first gas barrier layer and in the first substrate, and wherein the method further comprises:
filling a first adhesive material in the plurality of trenches;
disposing the electronic device on the first substrate;
providing a cover having a second gas barrier structure that protrudes out from a surface of the cover;
disposing a second adhesive material on the cover; and
adhering the first substrate to the cover so that the electronic device, the first gas barrier structure and the second gas barrier structure are located between the cover and the first substrate.

27. The method according to claim 26, wherein the electronic device comprises an active matrix organic light emitting diode (OLED) element or a passive matrix OLED element.

28. The method according to claim 26, wherein a material of the first or the second adhesive material comprises acrylic resin, epoxy resin or silicone.

29. The method according to claim 26, further comprising a third gas barrier layer on the first substrate at a side opposite to the first gas barrier layer.

30. The method according to claim 25, wherein the first substrate or the second substrate is a flexible substrate and a material of the first substrate of the second substrate comprises polyethylene terephthalate, polyethylene naphthalate, polyethersulfone, polymethyl methacrylate, polycarbonate, polyimide or a metal foil.

* * * * *